US012669526B2

(12) United States Patent
Lagler et al.

(10) Patent No.: US 12,669,526 B2
(45) Date of Patent: Jun. 30, 2026

(54) MEASUREMENT APPLICATION DEVICE

(71) Applicant: Rohde & Schwarz GmbH & Co. KG, Munich (DE)

(72) Inventors: Andreas Lagler, Rosenheim (DE); Martin Schmaehling, Wörthsee (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 242 days.

(21) Appl. No.: 18/398,920

(22) Filed: Dec. 28, 2023

(65) Prior Publication Data

US 2025/0216427 A1      Jul. 3, 2025

(51) Int. Cl.
G01R 23/16      (2006.01)
G01R 1/02      (2006.01)
G01R 23/12      (2006.01)
G01R 31/28      (2006.01)

(52) U.S. Cl.
CPC ............. G01R 23/16 (2013.01); G01R 1/025 (2013.01); G01R 23/12 (2013.01); G01R 31/28 (2013.01)

(58) Field of Classification Search
CPC ........ G01R 23/16; G01R 23/12; G01R 31/28; G01R 1/025
See application file for complete search history.

(56) References Cited

U.S. PATENT DOCUMENTS

| | | | | | |
|---|---|---|---|---|---|
| 5,214,500 | A * | 5/1993 | Takayama | .............. | H04N 17/02 |
| | | | | | 348/180 |
| 6,396,601 | B1 * | 5/2002 | Takara | ............. | H04B 10/07953 |
| | | | | | 398/79 |
| 7,337,079 | B2 * | 2/2008 | Park | ....................... | G01R 31/11 |
| | | | | | 702/59 |
| 7,601,120 | B2 * | 10/2009 | Moilanen | ............. | A61B 8/0875 |
| | | | | | 600/442 |
| 7,889,198 | B2 * | 2/2011 | Nara | ..................... | G01R 13/029 |
| | | | | | 345/440.1 |
| 8,040,158 | B2 * | 10/2011 | Suzuki | ................... | H04N 9/642 |
| | | | | | 348/505 |
| 8,626,000 | B2 * | 1/2014 | Abe | ................... | H04B 10/6165 |
| | | | | | 398/208 |
| 9,100,058 | B2 * | 8/2015 | Kanno | ..................... | H04B 5/77 |
| 10,624,612 | B2 * | 4/2020 | Sumi | .................. | G01N 29/0654 |
| 11,125,866 | B2 * | 9/2021 | Sumi | ................... | G01S 7/52025 |

(Continued)

OTHER PUBLICATIONS

Tektronix, TDS 684A, TDS 744A & TDS 784A Digitizing Oscilloscopes User Manual, 1994, pp. 1-245. (Year: 1994).*

(Continued)

*Primary Examiner* — Cheng Yuan Tseng
(74) *Attorney, Agent, or Firm* — BROOKS KUSHMAN P.C.

(57)      ABSTRACT

The present disclosure provides a measurement application device comprising a display device configured to display measured signals in a diagram, an input device configured to receive a first user-provided input marker, wherein the first user-provided input marker refers to a point in the diagram, and a computing device configured to calculate a difference value for each one of at least two diagram axes based in each case on the position of the first user-provided input marker and a second input marker in the diagram, wherein the computing device is further configured to calculate a result based on the calculated difference values.

15 Claims, 8 Drawing Sheets

(56) References Cited

U.S. PATENT DOCUMENTS

| | | | |
|---|---|---|---|
| 2007/0019768 A1* | 1/2007 | Furukawa | G01R 13/0272 |
| | | | 375/355 |
| 2021/0123959 A1* | 4/2021 | Prothero | G01R 23/18 |
| 2022/0077941 A1* | 3/2022 | Prothero | H04B 17/23 |

OTHER PUBLICATIONS

Anritsu Company, "Spectrum Analyzer Measurements: Setting Up Markers", 8 pages, 2023.
Rohde & Schwarz, R&S RTO2000 Oscilloscope User Manual, 11 pages, 2023.

* cited by examiner

MEASUREMENT APPLICATION DEVICE

TECHNICAL FIELD

The disclosure relates to embodiments of a measurement application device.

BACKGROUND

Although applicable to any type of laboratory measurement application device, the present disclosure will mainly be described in conjunction with oscilloscopes and spectrum analyzers.

The development of modern electronic devices may require analyzing a plurality of wired and wireless electronic signals. When analyzing such signals, the user may be required to analyze different characterizing values for the measured signals.

Accordingly, there is a need for improving signal measurements.

SUMMARY

The above stated problem is solved by the features of the independent claims. It is understood, that independent claims of a claim category may be formed in analogy to the dependent claims of another claim category.

Accordingly, it is provided:

A measurement application device comprising a display device configured to display measured signals in a diagram comprising at least a first diagram axis and a second diagram axis, an input device configured to receive a first user-provided input marker, wherein the first user-provided input marker refers to a point in the diagram, and a computing device configured to calculate a difference value for each one of at least two of the diagram axes based in each case on the position of the first user-provided input marker in the diagram, and a position of a second input marker in the diagram, wherein the second input marker refers to a point in the diagram and is provided by a user as a second user-provided input marker, or wherein the second input marker refers to a point in the diagram and is automatically provided by the computing device as a second automatic input marker, and wherein the computing device is further configured to calculate a result based on the calculated difference values.

Further, it is provided:

A measurement application device comprising a display device configured to display measured signals in a diagram comprising at least a first diagram axis showing a frequency of the measured signals and a second diagram axis showing the time, an input device configured to receive a first user-provided input marker, wherein the first user-provided input marker refers to a point in the diagram, and a computing device configured to calculate a difference value for each one of the at least two of the diagram axes based in each case on the position of the first user-provided input marker in the diagram, and a position of a second input marker in the diagram, wherein the second input marker refers to a point in the diagram and is automatically provided by the computing device as a second automatic input marker, wherein the computing device is further configured to calculate a slope of the measured signals based on the calculated difference values.

Further, it is provided:

A measurement application device comprising a display device configured to display measured signals in a diagram comprising at least a first diagram axis showing a frequency of the measured signals and a second diagram axis showing the time, an input device configured to receive a first user-provided input marker, wherein the first user-provided input marker refers to a point in the diagram, and a computing device configured to calculate a difference value for each one of the at least two of the diagram axes based in each case on the position of the first user-provided input marker in the diagram, and a position of a second input marker in the diagram, wherein the second input marker refers to a point in the diagram and is automatically provided by the computing device as a second automatic input marker, and wherein the computing device is further configured to calculate a chirp rate of the measured signals based on the calculated difference values.

The present disclosure is based on the finding that analyzing measured signals in many situations requires the user to perform manual calculations.

A user may for example measure a signal and have a measurement application device display the measured signal in a two-dimensional diagram or 2D diagram. In such a 2D diagram the user may then manually measure specific values and perform calculations on such values.

The present invention allows the user to automatically perform such calculations. Automatically performing calculations on specific values of a measured signal may e.g., be used for single-shot measurements, but also for repeated measurements, and long-term measurements.

With such automatic calculations, the user is not required to manually determine the required values in the diagram and perform calculations. Instead, the user will be able to directly read the value that is automatically calculated by the measurement application device.

To this end, the present disclosure provides the measurement application device with the display that serves to display measured signals in a diagram. Such a diagram may comprise two diagram axis or more than two diagram axis. Consequently, such a diagram may e.g., comprise a 2D diagram or a three-dimensional or 3D diagram.

The term 2D diagram or two-dimensional diagram may refer to a diagram with two axis, wherein a third dimension may be added e.g., by coloring the shown waveform. For example, the color of the waveform may refer to a signal power, while the two axes of the diagram may refer to a frequency and time.

The measured signals may be acquired or measured by the measurement application device e.g., via a measurement interface of the measurement application device. The measured signals may also be provided from an external source to the measurement application device. Such an external measurement source may e.g., comprise a database or another measurement application device.

The measurement application device further comprises an input device. The input device serves for receiving or acquiring a first user-provided input marker. Such a first user-provided input marker may be provided by the user e.g., via a touchscreen input device of the measurement application device, via a mouse-like device attached to the measurement application device, via a trackball-like device in the measurement application device, or any other type of adequate input device, like input keys of the measurement application device. A touchscreen input device may e.g., be provided with the display device.

The user will usually position the marker on a waveform of a measured signal. The measurement application device may support the user with a kind of snap function, as also explained below. In case that the user places the marker on a position in the diagram that has no signal component, a respective message may be displayed to the user. The measurement application device may also propose another position for the marker. Such a position may be selected as the nearest position that refers to a signal component of a measured signal or the position of a maximum signal component value near the originally selected position.

As explained above, in a 2D diagram, the color of the signal trace or waveform may e.g., refer to the signal power. In a diagram with a frequency axis, and a time axis, the signal trace or waveform may have a certain width, since the signal may not be sharply defined in the frequency range, and may have a power maximum about in the center of total width. If a user places the marker e.g., next to the signal trace of waveform, or at least not in the center i.e., the power maximum, the measurement application device may suggest to set the marker to the center. For example, the computing device may identify the maximum power and control the display to show a respective suggestion to the user.

In the measurement application device, the computing device is provided for performing an automatic calculation based on the first user-provided input marker, and a second input marker. The second input marker may also be provided by the user, or may be determined automatically by the computing device.

When automatically determining the second input marker, the computing device may use the position of the first user-provided input marker in the diagram and move along one of the axes e.g., the time axis, for a certain amount, therein following a signal trace or wave form marked by the first user-provided marker in the diagram. Following may refer to following the signal trace or waveform on the second axis while moving on the time axis. The second marker may then be set on the signal trace or wave form but moved at least on the time axis.

The first marker and the second marker my both be shown in the diagram, such that the user may easily identify the positions of the markers.

Each marker may e.g., be defined by an X-coordinate and a Y-coordinate in the diagram, wherein the X-coordinate refers to a position on the X-axis, and the Y-coordinate on a position on the Y-axis. It is understood, that the terms X-axis, and Y-axis may refer to any two axes that are orthogonal to each other and intersect in one point, for example, the axes of a cartesian coordinate system, with the origin of the cartesian coordinate system being the point of intersection of the two axes.

The computing device may then calculate a difference value for each one of at least two axes of the diagram based on the two input markers. The differences may e.g., be calculated based on the X-axis values, and the Y-axis values of the two markers.

Based on these differences, the computing device may then calculate and output a result to the user. The result may be provided to the user e.g., by displaying the result on the display.

The computing device may comprise or may be provided in or as part of at least one of a dedicated processing element e.g., a processing unit, a microcontroller, a field programmable gate array, FPGA, a complex programmable logic device, CPLD, an application specific integrated circuit, ASIC, or the like. A respective program or configuration may be provided to implement the required functionality. The computing device may at least in part also be provided as a non-transitory computer program product comprising computer readable instructions that may be executed by a processing element. In a further embodiment, the computing device may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them. The same applies to any other element, unit or function disclosed herein as part of the measurement application device.

In addition, it is understood, that any required supporting or additional hardware may be provided like e.g., a power supply circuitry and clock generation circuitry.

Generally, any computer program or computer program product disclosed herein is to be understood as a non-transitory computer program product.

A measurement application device according to the present disclosure may comprise any device that may be used in a measurement application to acquire an input signal or to generate an output signal, or to perform additional or supporting functions in a measurement application. A measurement application device may also comprise or be implemented as program application or program applications, also called measurement program application or measurement program applications, that may be executed on a computer device and that may communicate with other measurement application devices in order to perform a measurement task. A measurement application, also called measurement setup, may e.g., comprise at least one or multiple different measurement application devices for performing electric, magnetic, or electromagnetic measurements, especially on single devices under test. Such electric, magnetic, or electromagnetic measurements may e.g., be performed in a measurement laboratory or in a production facility in the respective production line. An exemplary measurement application or measurement setup may serve to qualify the single devices under test i.e., to determine the proper electrical operation of the respective devices under test.

Measurement application devices to this end may comprise at least one signal acquisition section for acquiring electric, magnetic, or electromagnetic signals to be measured from a device under test, or at least one signal generation section for generating electric, magnetic, or electromagnetic signals that may be provided to the device under test. Such a signal acquisition section may comprise, but is not limited to, a front-end for acquiring, filtering, and attenuating or amplifying electrical signals. The signal generation section may comprise, but is not limited to, respective signal generators, amplifiers, and filters. In embodiments, the signal acquisition is performed via the signal acquisition section in a wired or contact-based manner or fashion. To this end, a respective measurement probe may be coupled to the measurement application device via a respective cable. In embodiments, the signal generation and emission are performed via the signal generation section in a wired or contact-based manner or fashion. To this end, a respective signal output probe may be coupled to the measurement application device via a respective cable, or the signal may be output directly via the cable e.g., to a device under test.

Further, when acquiring signals, measurement application devices may comprise a signal processing section that may process the acquired signals. Processing may comprise converting the acquired signals from analog to digital signals, and any other type of digital signal processing, for example, converting signals from the time-domain into the frequency-domain.

The measurement application device may also comprise a housing that may be provided and that comprises the elements of the measurement application device. It is understood, that further elements, like power supply circuitry, and communication interfaces may be provided.

A measurement application device may be a stand-alone device that may be operated without any further element in a measurement application to perform tests on a device under test. Of course, communication capabilities may also be provided for the measurement application device to interact with other measurement application devices.

A measurement application device may comprise, for example, a signal acquisition device e.g., an oscilloscope, especially a digital oscilloscope, a spectrum analyzer, or a vector network analyzer. Such a measurement application device may also comprise a signal generation device e.g., a signal generator, especially an arbitrary signal generator, also called arbitrary waveform generator, or a vector signal generator. Further possible measurement application devices comprise devices like calibration standards, or measurement probe tips.

Of course, at least some of the possible functions, like signal acquisition and signal generation, may be combined in a single measurement application device.

In embodiments, the measurement application device may comprise pure data acquisition devices that are capable of acquiring an input signal and of providing the acquired input signal as digital input signal to a respective data storage or application server. Such pure data acquisition devices not necessarily comprise a user interface or display. Instead, such pure data acquisition devices may be controlled remotely e.g., via a respective data interface, like a network interface or a USB interface. The same applies to pure signal generation devices that may generate an output signal without comprising any user interface or configuration input elements. Instead, such signal generation devices may be operated remotely via a data connection.

In embodiments, the measurement application device may be provided e.g., as a remote-control or measurement data analysis application for remotely controlling a measurement application device. Such a remote-control or measurement data analysis application may e.g., be a website that may be loaded from a server to a user device, like a computer, smartphone, or tablet PC. The website may comprise interactive elements, that may e.g., be provided using JavaScript programs, that allow the website to perform the functions disclosed herein for the measurement application device. In other embodiments, the remote-control or measurement data analysis application may be provided as native application that may be executed by the operating system of a respective user device.

A computer program product according to the present disclosure may in any embodiment disclosed herein, comprise instructions for implementing the method, or the functions of the measurement application device as a purely computer-implemented method that is executed by a processor. Such a method may comprise steps of acquiring data or user input, or of outputting data or providing information to a user. It is understood, that in the case of a purely computer implemented method the method may comprise instructions that cause the processor to access peripherals of the computer that carries the processor that executes the instructions. If no other information is provided herein, the respective peripherals are those peripherals of the computer that perform the same function as the respective elements of the measurement application device described as performing the same function. For example, a network interface of the computer may serve for receiving measurement data or for outputting measurement data.

Any reference in the present disclosure to the display device displaying any kind of information, is meant to encompass any type of control of the display device that leads to the respective information being displayed. To this end, the measurement application device may comprise display controller, or the computing device alone or in combination with a display controller may control the display accordingly.

Further embodiments of the present disclosure are subject of the further dependent claims and of the following description, referring to the drawings.

In the following, the dependent claims referring directly or indirectly to claim 1 are described in more detail. For the avoidance of doubt, the features of the dependent claims relating to independent claim 1 can be combined in all variations with each other and the disclosure of the description is not limited to the claim dependencies as specified in the claim set. Further, the features of the other independent claims referring to independent claim 1 may be combined with any of the features of the other independent claims or the dependent claims relating to any one of the other independent claims. In a respective method, respective method steps may perform the function of the respective apparatus elements, and in a respective apparatus, respective apparatus elements may perform the respective method steps.

In an embodiment, which can be combined with all other embodiments mentioned above or below, the diagram may comprise a two-dimensional diagram, and the computing device may be configured to calculate a first difference value for the X-axis of the two-dimensional diagram, and a second difference value for the Y-axis of the two-dimensional diagram.

The diagram may have any number of axes starting from two axes. With two axes, one axis may be the X-axis. This axis may be the horizontal axis. The other axis may be Y-axis. This axis may be the vertical axis. Of course, the X-axis and the Y-axis may also be exchanged.

The measurement application device, or the display device, may also allow a user to rotate the diagram in two- or three-dimensional space. Especially, with a diagram that comprises three axes, this allows a user to position the diagram as required.

In embodiments, the first difference value may be calculated by subtracting the X-axis value of the first user-provided input marker from the X-axis value of the second input marker, or vice versa. The second difference value may be calculated by subtracting the Y-axis value of the first user-provided input marker from the Y-axis value of the second input marker, or vice versa.

In embodiments, the second difference value may be calculated by subtracting the X-axis value of the first user-provided input marker from the X-axis value of the second input marker, or vice versa. The first difference value may be calculated by subtracting the Y-axis value of the first user-provided input marker from the Y-axis value of the second input marker, or vice versa.

In another embodiment, which can be combined with all other embodiments mentioned above or below, the computing device may be configured to calculate the result by dividing the first difference value by the second difference value.

Dividing the first difference value by the second difference value allows calculating a plurality of different characteristic values for the measured signals, depending on the nature of the measured signals.

In a further embodiment, which can be combined with all other embodiments mentioned above or below, one diagram axis may refer to time, and the other diagram axis may refer to the frequency of the measured signals. The computing device may be configured to calculate the chirp rate of the measured signals as result by dividing the difference value referring to the frequency of the measured signals by the difference value referring to time.

The above may be applied to a diagram with any number of axes starting from two, wherein one axis refers to time, and another axis refers to the frequency of the measured signals.

In such embodiments, a user may place the first marker and e.g., also the second marker, in the diagram. The second marker may also be placed automatically by the computing device, as explained above. The computing device may then calculate the chirp rate automatically for the user based on the measured signals, and the markers placed by the user.

The chirp rate may be calculated as the difference of the second frequency and the first frequency divided by the difference of the second time and the first time:

$$\text{chirp rate}=(\text{frequency2}-\text{frequency1})/(\text{time2}-\text{time1})$$

In another embodiment, which can be combined with all other embodiments mentioned above or below, one diagram axis may refer to time, and the other diagram axis may refer to the phase of the measured signals. The computing device may be configured to calculate the phase drift of the measured signals as result by dividing the difference value referring to the phase by the difference value referring to time.

The above may be applied to a diagram with any number of axes starting from two, wherein one axis refers to time, and another axis refers to the phase of the measured signals.

In such embodiments, a user may place the first marker and e.g., also the second marker, in the diagram. The second marker may also be placed automatically by the computing device, as explained above. The computing device may then calculate the phase drift automatically for the user based on the measured signals, and the markers placed by the user.

The phase drift may be calculated as the difference of the second phase and the first phase divided by the difference of the second time and the first time:

$$\text{phase drift}=(\text{phase2}-\text{phase1})/(\text{time2}-\text{time1})$$

In an embodiment, which can be combined with all other embodiments mentioned above or below, one diagram axis may refer to time, and the other diagram axis may refer to the amplitude of the measured signals. The computing device may be configured to calculate the amplitude droop of the measured signals as result by dividing the difference value referring to the amplitude by the difference value referring to time.

The above may be applied to a diagram with any number of axes starting from two, wherein one axis refers to time, and another axis refers to the amplitude of the measured signals.

In such embodiments, a user may place the first marker and e.g., also the second marker, in the diagram. The second marker may also be placed automatically by the computing device, as explained above. The computing device may then calculate the amplitude droop automatically for the user based on the measured signals, and the markers placed by the user.

The amplitude droop may be calculated as the difference of the second amplitude and the first amplitude divided by the difference of the second time and the first time:

$$\text{amplitude droop}=(\text{amplitude2}-\text{amplitude1})/(\text{time2}-\text{time1})$$

In a further embodiment, which can be combined with all other embodiments mentioned above or below, one diagram axis may refer to time, another diagram axis may refer to the frequency of the measured signals, and another diagram axis may refer to a power value of the measured signals. The computing device may be configured to calculate the chirp rate of the measured signals by dividing the difference value referring to the frequency of the measured signals by the difference value referring to time, and to output an information about at least one of intermodulation products and harmonics of the chirp rate based on the calculated chirp rate.

The above may be applied to any diagram that shows the measured signals, especially a diagram with three axes, wherein one axis refers to time, another axis refers to the frequency of the measured signals, and another axis to the power of the measured signals.

In such embodiments, a user may place the first marker and e.g., also the second marker, in the diagram. The computing device may then calculate the chirp rate automatically based on the measured signals, and the markers placed by the user.

The chirp rate may be calculated as the difference of the second frequency and the first frequency divided by the difference of the second time and the first time:

$$\text{chirp rate}=(\text{frequency2}-\text{frequency1})/(\text{time2}-\text{time1})$$

The computing device may then calculate and output as result an information about at least one of intermodulation products and harmonics of the chirp rate based on the calculated chirp rate.

Since the frequency of the n-th order harmonic is n times the frequency of the fundamental, the chirp rate of harmonics is also n times the chirp rate of the "fundamental" chirp signal. Intermodulation products can have chirp rates of +/−n times the fundamental chirp rate, i.e. slopes can be positive and/or negative.

In another embodiment, which can be combined with all other embodiments mentioned above or below, one diagram axis may refer to a Q-component of the measured signals, another diagram axis may refer to I-component of the measured signals, and the diagram shows an error vector magnitude diagram. The computing device may be configured to calculate the difference between two markers in a Q vs I diagram. This difference may be outputted or displayed as an error vector magnitude.

In an embodiment, which can be combined with all other embodiments mentioned above or below, the display device may be configured to show the diagram as a waterfall diagram over a predetermined frequency range and a predetermined time. The input device may be configured to receive the first user-provided input marker, and the second input marker at different positions in the waterfall diagram.

The waterfall diagram may be continuously updated with updated or new measured signals. Providing a waterfall diagram and allowing a user to provide the markers in the waterfall diagram provides a very flexible way for the user to determine the required result.

In the waterfall diagram, a third axis may represent e.g., the signal power for the respective frequency and point in time.

In a further embodiment, which can be combined with all other embodiments mentioned above or below, the input device may be configured to detect a user input on one of the markers or in a predetermined distance from one of the markers, and move the respective marker in the diagram according to the user input.

The predetermined distance may serve to define a kind of snap-in region around a marker that allows a user to easily select the respective marker for moving the marker to another position.

A user may e.g., tap a marker on a touchscreen display device of the measurement application device and move the marker by dragging it over the touchscreen display device.

In another embodiment, which can be combined with all other embodiments mentioned above or below, the input device may be configured to receive a user selection of one of the markers. The display device may be configured to modify the appearance of the marker that is selected by the user selection.

A user may select one of the markers e.g., by tapping on the marker on a touchscreen display device of the measurement application device, or with a mouse.

The appearance of the respective marker may then be modified on the display, such that the user may easily perceive that the respective marker is selected. This allows the user to select or activate other functions of the measurement application device, while the marker is selected.

In an embodiment, which can be combined with all other embodiments mentioned above or below, the input device may be configured to receive a position input while a marker is selected. The display device may be configured to move the marker to a position in the diagram that corresponds to the received position input.

By moving a formerly selected marker to a new position, the measurement application device allows a user to easily reconfigure the measurement.

In embodiments, the display device may also provide additional assistance to the user. The display device may e.g., draw a line between the two markers in the diagram.

In a further embodiment, which can be combined with all other embodiments mentioned above or below, the display device may further be configured to continuously update the diagram based on the measured signals. The computing device may further be configured to continuously recalculate the result based on the updated diagram and the positions of the first user-provided input marker, and the second input marker.

Continuously updating the display and recalculating the result supports a user in analyzing signals during operation of a device under test or a long-lasting measurement application execution.

In another embodiment, which can be combined with all other embodiments mentioned above or below, the input device may be configured to receive a user input, and the display device is configured to set the first user-provided input marker or the second marker to the highest signal value of the measurement signal in a predetermined distance from the position where the user input was received at in the diagram.

By setting the marker automatically to the position of the highest signal value within a specific distance from the user input in the diagram, it is easy for the user to accurately select the relevant point on the diagram for setting the marker. If the signal does not comprise a signal value information e.g., in a 2D diagram, the nearest position that comprises any signal component may be selected.

In embodiments, the point for setting the marker may be determined in a circle around the position of the user input. In other embodiments, the point for setting the marker may be determined on a line parallel to the X-axis, or parallel to the Y-axis from the position of the user input. This allows a user to e.g., select a fixed point on the time axis, and at the same time automatically moving the marker to the highest signal value near his input on the other axis.

In an embodiment, which can be combined with all other embodiments mentioned above or below, the computing device may be configured to calculate a chirp rate based on at least one of the calculated slope, and the calculated difference values.

In a further embodiment, which can be combined with all other embodiments mentioned above or below, the diagram may be a waterfall diagram further comprising a third axis showing a signal power of the measured signals.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
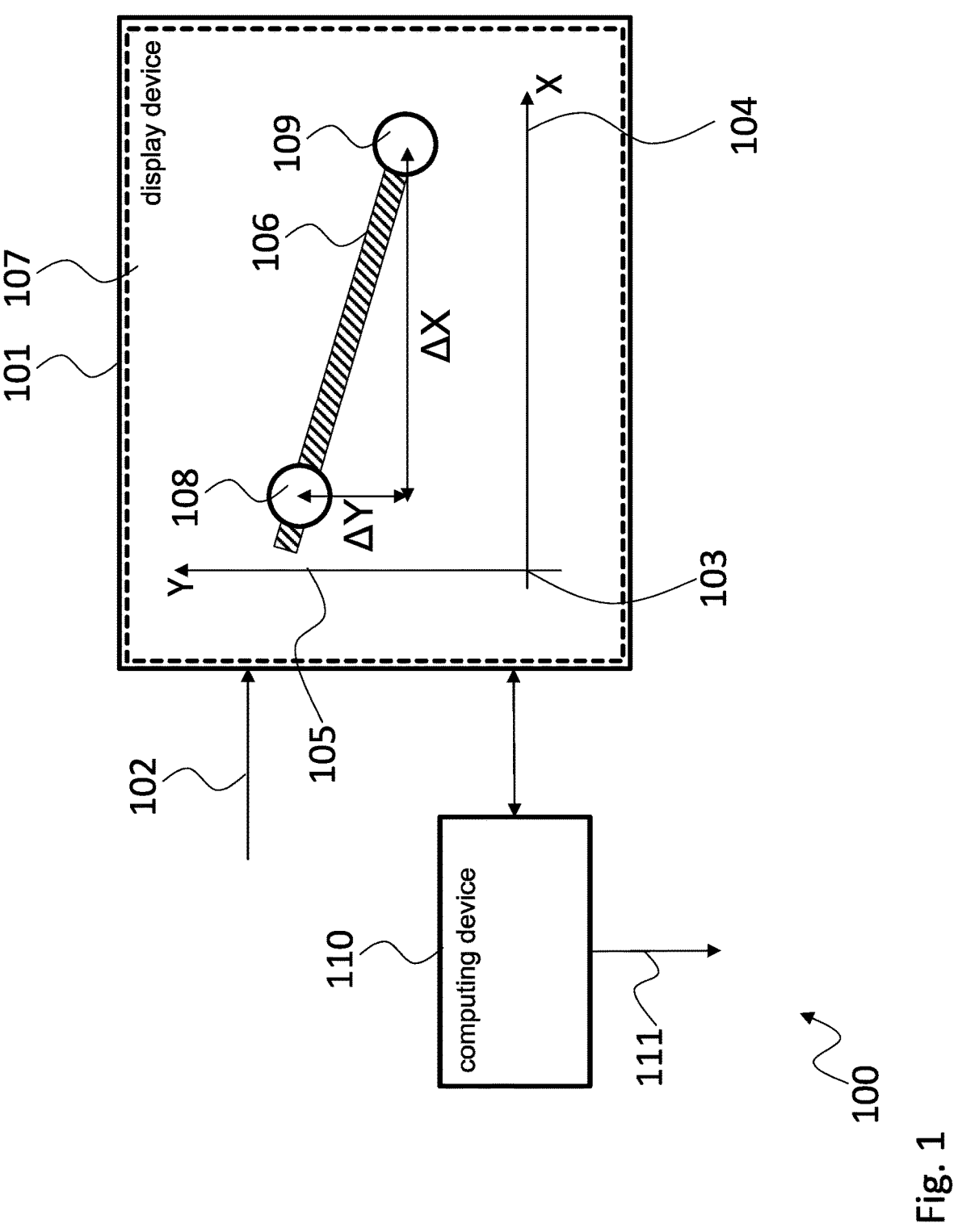
FIG. 1 shows an embodiment of a measurement application device according to the present disclosure.

FIG. 1 shows a measurement application device 100. The measurement application device 100 comprises display device 101 that receives a measured signal 102 and displays a diagram 103 based on the measured signal 102. Further, in the measurement application device 100, an input device 107 is provided as a touchscreen device in the display device 101. The measurement application device 100 further comprises a computing device 110 that is coupled to the display device 101.

The diagram 103 shown on display device 101 comprises first diagram axis 104 or X axis 104, and a second diagram axis 105 or Y axis 105.

The input device 107 may receive a first user-provided input marker 108. The user may simply tap on the touchscreen at the corresponding position. A second marker 109 may also be provided by the user, or may be automatically determined e.g., as already explained above.

The computing device 110 may calculate a difference value for each one of the diagram axes 104, 105 based in each case on the position of the first user-provided input marker 108 in the diagram 103, and the position of the second input marker 109 in the diagram 103.

The computing device 110 may e.g., calculate two difference value ΔX, and ΔY.

The computing device 110 may then calculate a result 111 based on the calculated difference values ΔX, and ΔY. The result 111 may comprise e.g., a chirp rate, a phase drift, or an amplitude droop, as explained above.

In embodiments, the measured signal 102 may be provided in a preprocessed form i.e., comprising the values that correspond to the two axes 104, 105. In other embodiments, the measurement application device 100 e.g., the computing device 110, may calculate the values to be shown in the diagram 103 based on the measured signal 102. The measured signal 102 may e.g., comprise a time series of values recorded in a device under test, the measurement application device 100 may then calculate the frequency spectrum for the measured signal 102, and show a frequency over time graph or waveform in the diagram 103.

Figure 2:
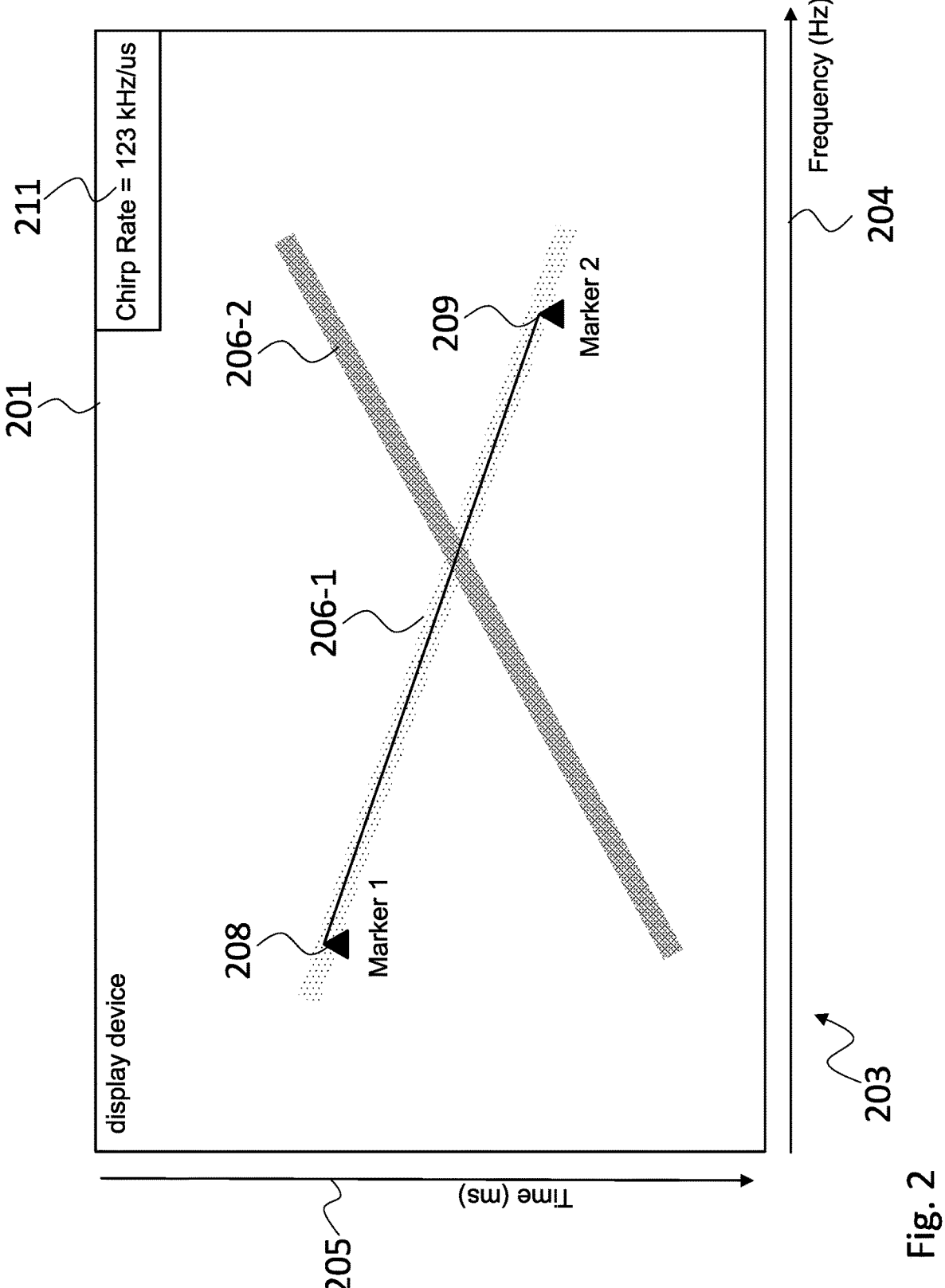
FIG. 2 shows a diagram as it may be displayed with an embodiment of a measurement application device according to the present disclosure.

FIG. 2 shows a diagram 203, which is a waterfall diagram. The diagram 203 comprises a horizontal first axis 204 that represents the signal frequency, and a vertical second axis 205 that represents time. In the top right corner of the diagram 203 the result of the calculation performed by the computing device is shown, in this case a chirp rate of 123 kHz/us.

In the diagram 203 two exemplary signal traces 206-1, 206-2 are shown, wherein more or less signal traces are possible. Signal trace 206-1 follows a line from the top left to the lower right of the diagram 203, and signal trace 206-2 follows a line from the lower left to the top right of the diagram 203.

Further, two markers 208, 209 are shown. Marker 208 is positioned near the left end of signal trace 206-1, and marker 209 is positioned near the right end of signal trace 206-1. The two markers 208, 209 are connected by a solid line, which is optional.

As already explained with regard to FIG. 1, two differences may be calculated based on the marker positions, and a result, in this case the chirp rate, may be automatically calculated by the computing device.

One of the two differences may be calculated for the positions or values of the markers 208, 209 regarding the time, and the other difference may be calculated for the positions or values of the markers regarding the frequency.

Figure 3:
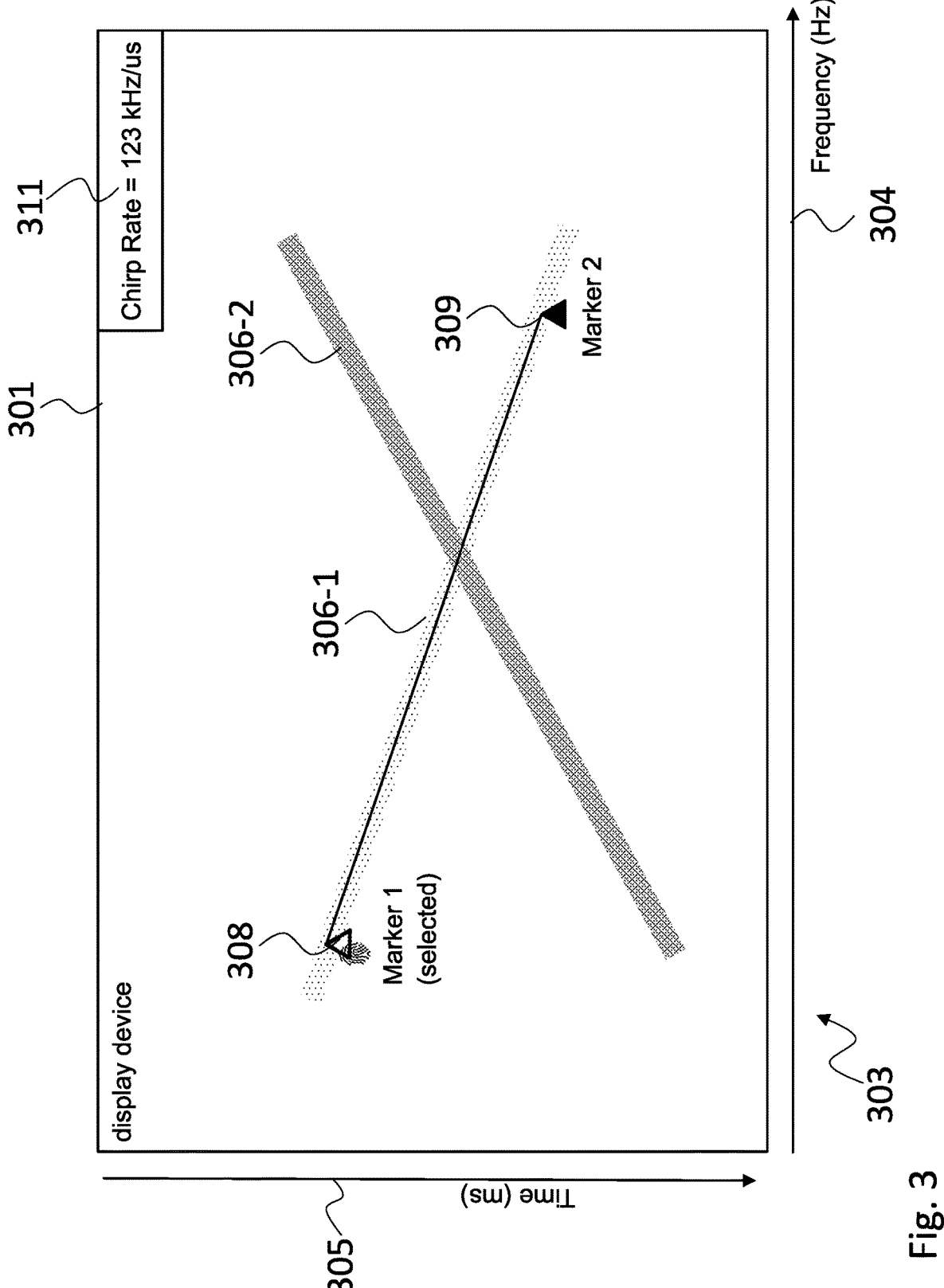
FIG. 3 shows another diagram as it may be displayed with an embodiment of a measurement application device according to the present disclosure.

FIG. 3 shows a diagram 303, which is a waterfall diagram. The diagram 303 comprises a horizontal first axis 304 that represents the signal frequency, and a vertical second axis 305 that represents time. In the top right corner of the diagram 303 the result of the calculation performed by the computing device is shown, in this case a chirp rate of 123 kHz/us.

In the diagram 303 two signal traces 306-1, 306-2 are shown. Signal trace 306-1 follows a line from the top left to the lower right of the diagram 303, and signal trace 306-2 follows a line from the lower left to the top right of the diagram 303.

Further, two markers 308, 309 are shown. Marker 308 is positioned near the left end of signal trace 306-1, and marker 309 is positioned near the right end of signal trace 306-1. The two markers 308, 309 are connected by a solid line, which is optional.

In the diagram 303 a fingerprint symbol is shown on marker 308, and in contrast to marker 309, the triangle representing marker 308 is not filled to indicate that marker 308 is selected by the user via a touchscreen of the display device 301. In other embodiments, other types of visual modifications may be provided to the markers 308, 209, when one is selected by the user. The user may move the selected marker, in this case marker 308, e.g., by dragging the marker on the touchscreen of the display device 301. In other embodiments, the user may move the selected marker by first tapping on the marker 308, and then on the new positions for the marker 308.

In embodiments, the measurement application device may offer further functions that may be performed on or with the selected marker 308. In embodiments, a context menu may open next to the marker 308 after selection by the user.

Figure 4:
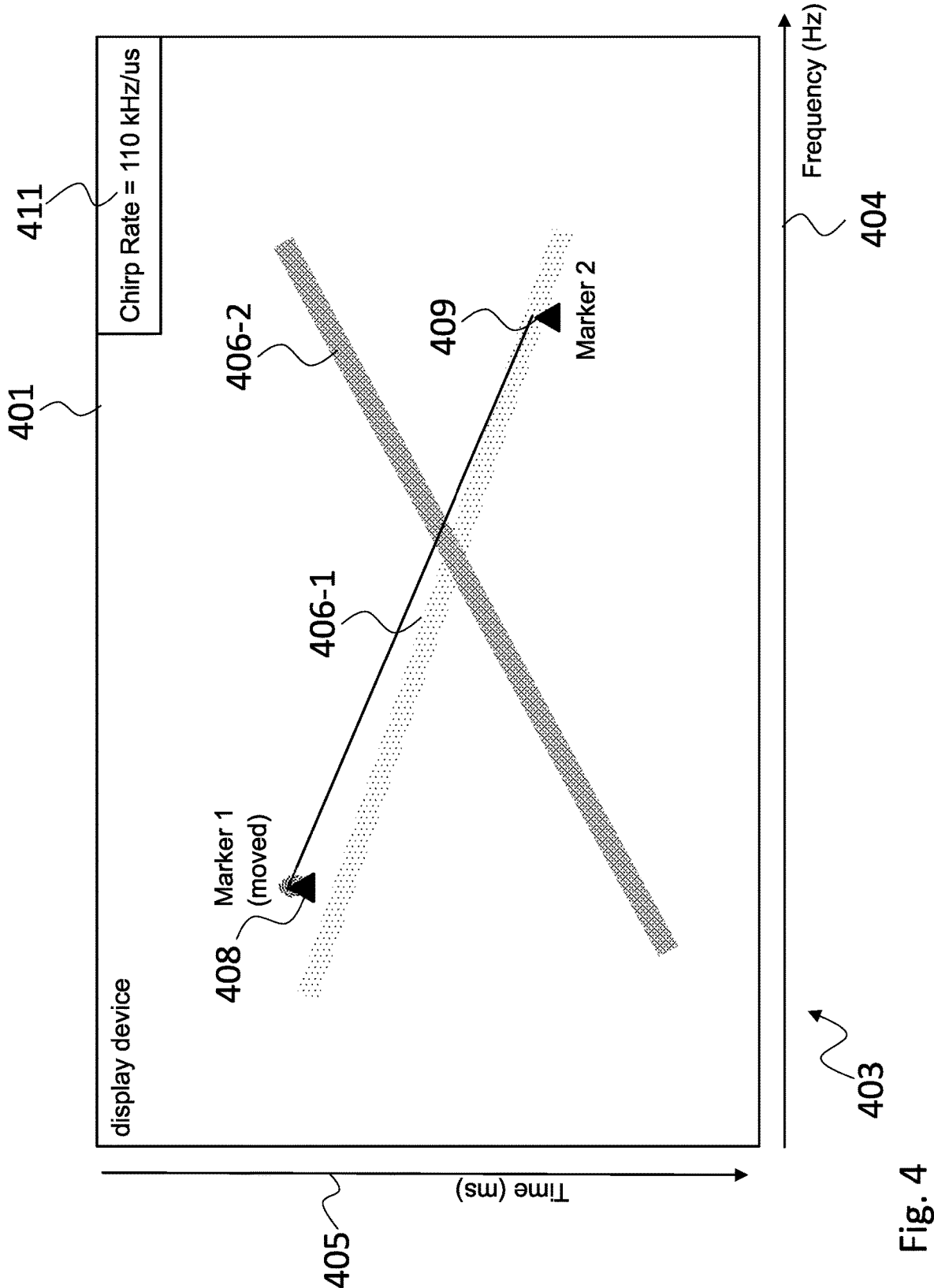
FIG. 4 shows another diagram as it may be displayed with an embodiment of a measurement application device according to the present disclosure.

FIG. 4 shows a diagram 403, which is a waterfall diagram. The diagram 403 comprises a horizontal first axis 404 that represents the signal frequency, and a vertical second axis 405 that represents time. In the top right corner of the diagram 403 the result of the calculation performed by the computing device is shown, in this case a chirp rate of 110 kHz/us.

In the diagram 403 two signal traces 406-1, 406-2 are shown. Signal trace 406-1 follows a line from the top left to the lower right of the diagram 403, and signal trace 406-2 follows a line from the lower left to the top right of the diagram 403.

Further, two markers 408, 409 are shown. Marker 408 is positioned near the left end of signal trace 406-1, and marker 409 is positioned near the right end of signal trace 406-1. The two markers 408, 409 are connected by a solid line, which is optional.

In the diagram 403 a user moved the first marker 408 e.g., as explained above by selecting and dragging the marker 408. It can be seen that the calculated chirp rate changed from 123 kHz/us in the diagram 303, to 110 kHz/us in the diagram 403. In embodiments, like the one of FIG. 4, the computing device may calculate the result even if at least one of the markers is not set on a signal trace, purely based on the positions of the markers and the respective axes-values.

Figure 5:
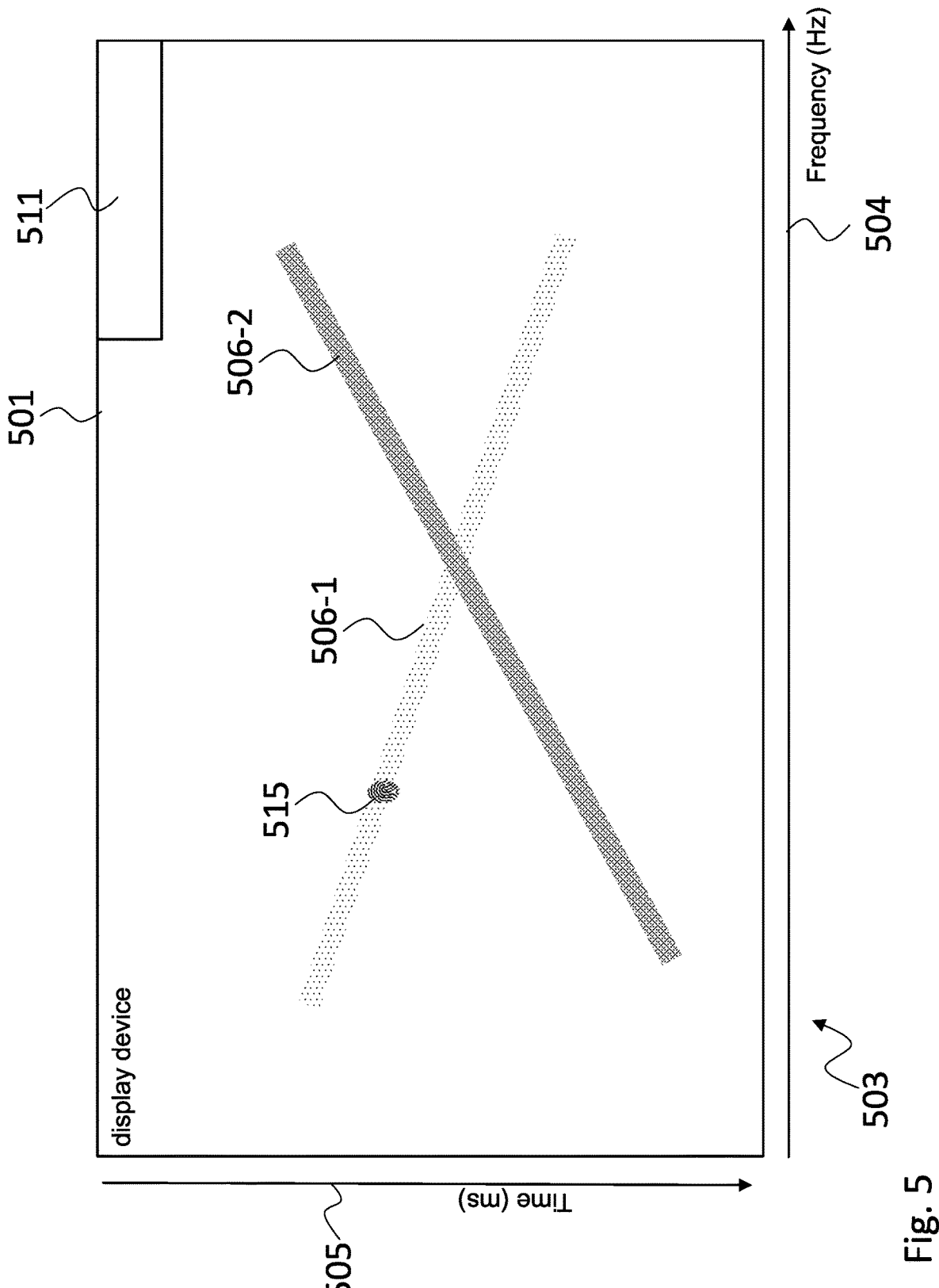
FIG. 5 shows another diagram as it may be displayed with an embodiment of a measurement application device according to the present disclosure.

FIG. 5 shows a diagram 503, which is a waterfall diagram. The diagram 503 comprises a horizontal first axis 504 that represents the signal frequency, and a vertical second axis 505 that represents time. In the top right corner of the diagram 503 a space for the result of the calculation performed by the computing device is shown, which in this case is not yet calculated.

In the diagram 503 two signal traces 506-1, 506-2 are shown. Signal trace 506-1 follows a line from the top left to the lower right of the diagram 503, and signal trace 506-2 follows a line from the lower left to the top right of the diagram 503.

Further, a fingerprint is shown as user input 515. The measurement application device that generates the diagram 503 may automatically determine the position of the first marker, and the second marker based on the user input 515, as shown in FIG. 6.

Figure 6:
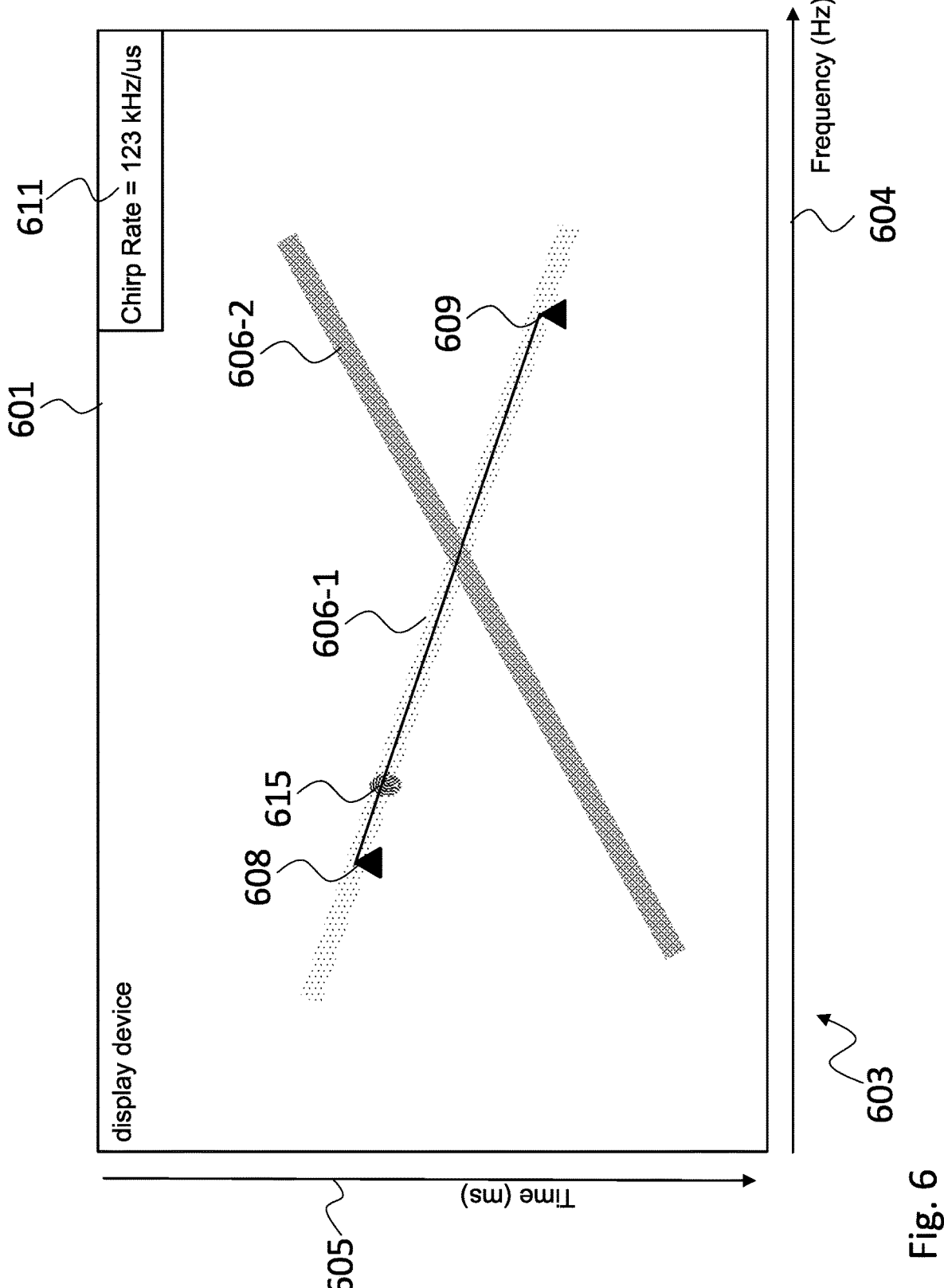
FIG. 6 shows another diagram as it may be displayed with an embodiment of a measurement application device according to the present disclosure.

FIG. 6 shows the diagram 603 that is based on the diagram 503 of FIG. 5, and comprises two markers 608, 609. The markers 608, 609 are automatically provided in the diagram 603 e.g., by the computing device that is also provided in the measurement application device.

The first marker 608 is provided near the user input 615, that is at the same position as user input 515 in FIG. 5. The first marker 608 may be provided at the exact position of the user input 615 in embodiments. In the diagram 603, the first marker 608 is, however, provided at an earlier point in time on the signal trace 606-1 in order to increase the signal range used for the calculations.

The second marker 609 is automatically positioned at the lower right end of signal trace 606-1. The positions of the markers 608, 609 may be determined as explained above.

Figure 7:
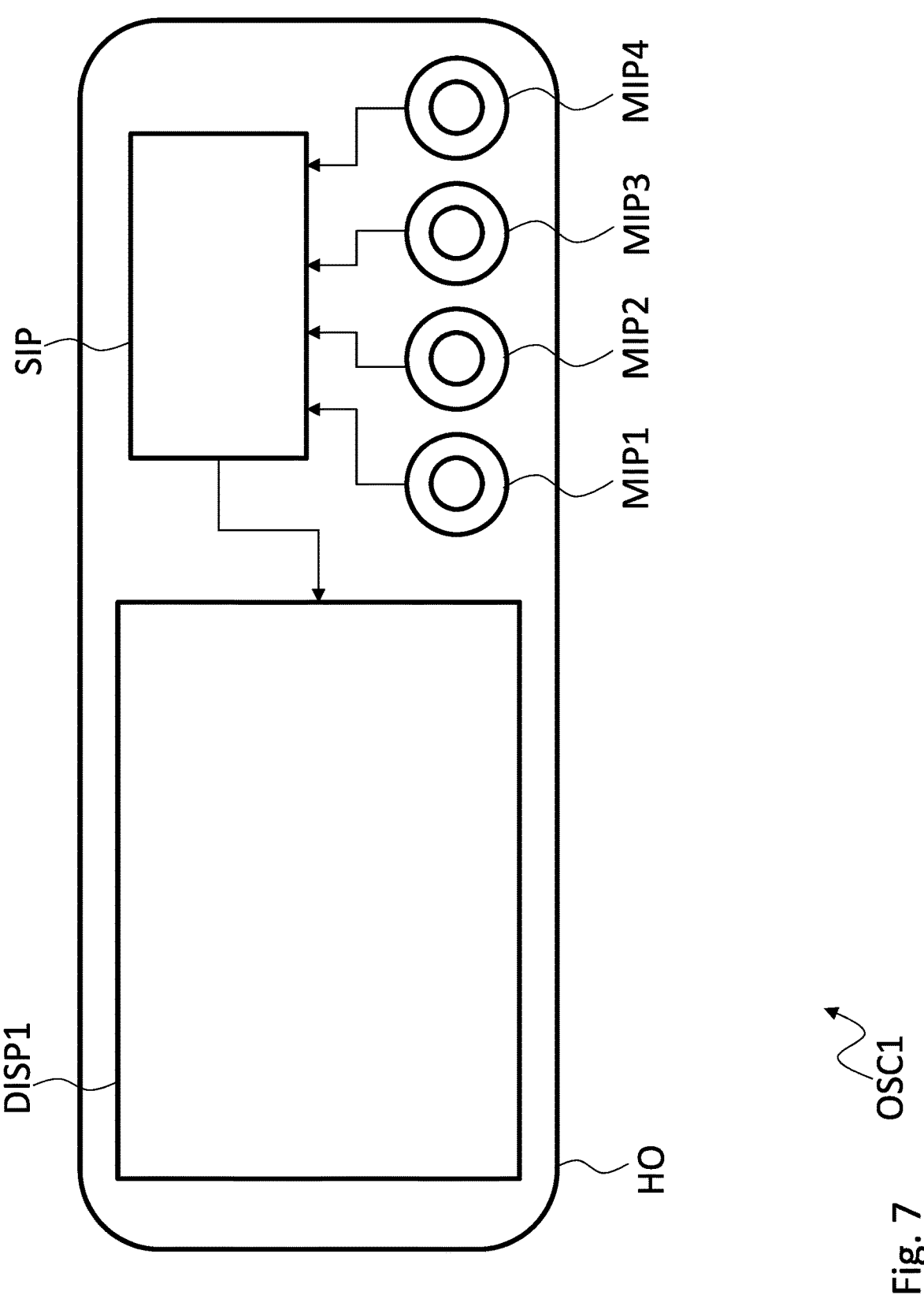
FIG. 7 shows another embodiment of a measurement application device according to the present disclosure.

FIG. 7 shows a block diagram of an oscilloscope OSC1 that may be used as an embodiment of a measurement application device according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals and diagrams according to the present disclosure to a user.

Although not explicitly shown, it is understood, that the oscilloscope OSC1 may also comprise signal outputs. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

In the oscilloscope OSC1 the signal processor SIP or an additional processing element may perform the function of computing device according to the present disclosure, or may implement the computing device. Of course, a communication interface may be provided in the oscilloscope OSC1 for communication with other measurement application devices.

Figure 8:
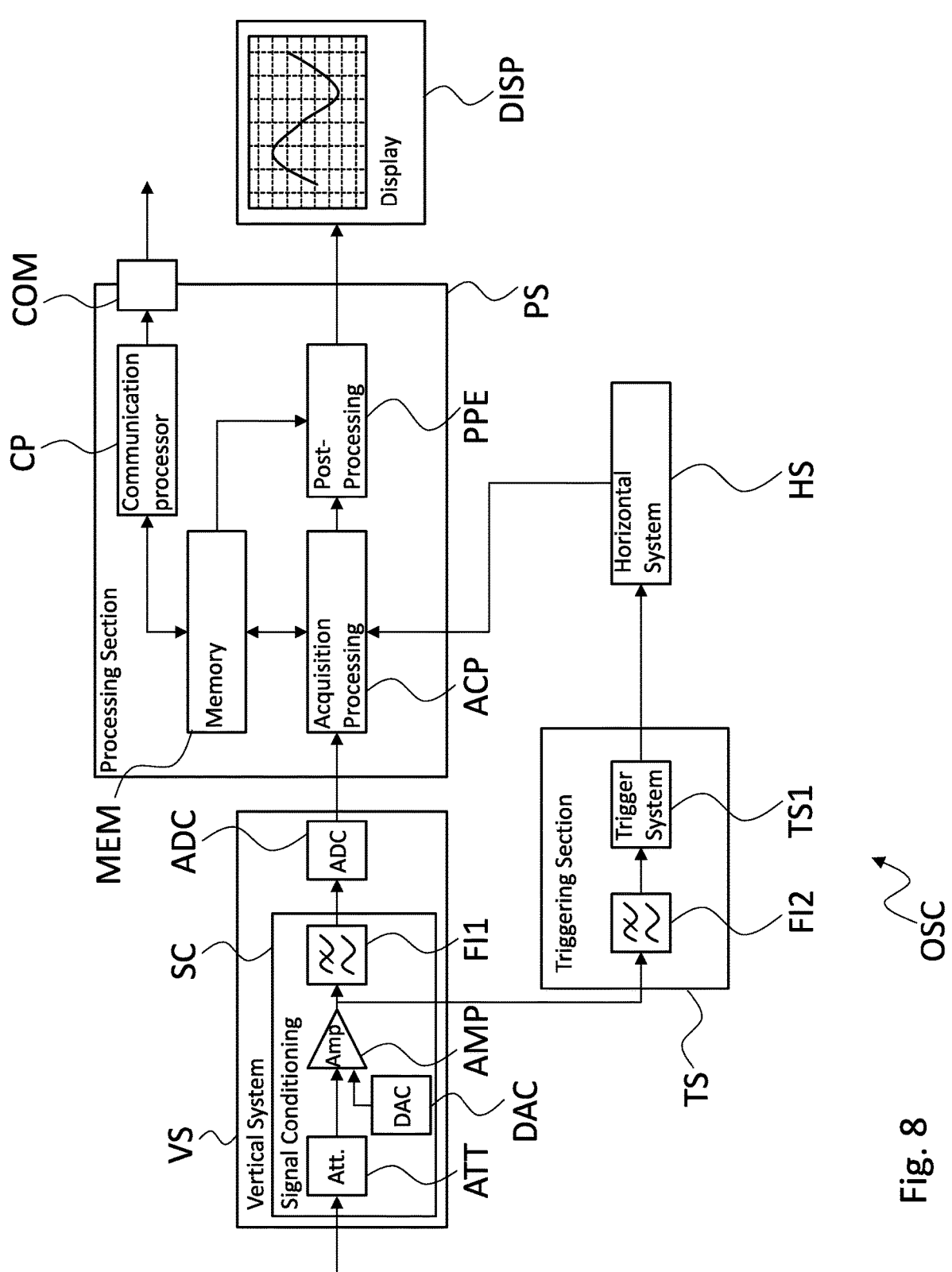
FIG. 8 shows another embodiment of a measurement application device according to the present disclosure.

FIG. 8 shows a block diagram of an oscilloscope OSC that may be an implementation of a measurement application device according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS, and the display DISP. It is understood, that the partitioning into five general sections is a logical partitioning and does not limit the placement and implementation of any of the elements of the oscilloscope OSC in any way.

The vertical system VS mainly serves for offsetting, attenuating, and amplifying a signal to be acquired. The signal may for example be modified to fit in the available space on the display DISP or to comprise a vertical size as configured by a user.

To this end, the vertical system VS comprises a signal conditioning section SC with an attenuator ATT and a digital-to-analog-converter DAC that are coupled to an amplifier AMP. The amplifier AMP is coupled to a filter FI1, which in the shown example is provided as a low pass filter. The vertical system VS also comprises an analog-to-digital converter ADC that receives the output from the filter FI1 and converts the received analog signal into a digital signal.

The attenuator ATT and the amplifier AMP serve to scale the amplitude of the signal to be acquired to match the operation range of the analog-to-digital converter ADC. The digital-to-analog-converter DAC serves to modify the DC component of the input signal to be acquired to match the operation range of the analog-to-digital converter ADC. The filter FI1 serves to filter out unwanted high frequency components of the signal to be acquired.

The triggering section TS operates on the signal as provided by the amplifier AMP. The triggering section TS comprises a filter FI2, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

In order to allow an exact matching of the trigger event and the waveform that is shown on the display DISP, a common time base may be provided for the analog-to-digital converter ADC and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the amplifier AMP but will operate on the digital signal as provided by the analog-to-digital converter ADC.

A digital triggering section may comprise a processing element, like a processor, a DSP, a CPLD, an ASIC or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC and the output of the horizontal system HS as well as to a memory MEM and a post processing element PPE.

The acquisition processing element ACP manages the acquisition of digital data from the analog-to-digital converter ADC and the storage of the data in the memory MEM. The acquisition processing element ACP may for example comprise a processing element with a digital interface to the analog-to-digital converter ADC2 and a digital interface to the memory MEM. The processing element may for example comprise a microcontroller, a DSP, a CPLD, an ASIC or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA opposed to software being executed by a processor.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infra-red communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user. The post processing element PPE may also realize analysis functions like cursors, waveform measurements, histograms, or math functions.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

In the oscilloscope OSC, any one of the processing elements in the processing section PS or an additional processing element may perform the function computing device according to the present disclosure.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software, and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, case of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS 100 measurement application device
101, 201, 301, 401, 501, 601 display device
102 measured signal
103, 203, 303, 403, 503, 603 diagram
104, 204, 304, 404, 504, 604 first diagram axis
105, 205, 305, 405, 505, 605 second diagram axis
106, 206-1, 206-2, 306-1, 306-2, 406-1 signal trace
406-2, 506-1, 506-2, 606-1, 606-2 signal trace
107 input device
108, 208, 308, 408, 608 first user-provided input marker
109, 209, 309, 409, 609 second input marker
110 computing device
111, 211, 311, 411, 511, 611 result
515, 615 user input
OSC1 oscilloscope
HO housing
MIP1, MIP2, MIP3, MIP4 measurement input
SIP signal processing
DISP1 display
OSC oscilloscope
VS vertical system
SC signal conditioning
ATT attenuator
DAC1 analog-to-digital converter
AMP amplifier
FI1 filter
DAC digital-to-analog converter
ADC analog-to-digital converter
TS triggering section
AMP2 amplifier
FI2 filter
TS1 trigger system
HS horizontal system

18

PS processing section
ACP acquisition processing element
MEM memory
PPE post processing element
DISP display

What is claimed is:

1. Measurement application device comprising:
a display device configured to display measured signals in a diagram comprising at least a first diagram axis and a second diagram axis;
an input device configured to receive a first user-provided input marker, wherein the first user-provided input marker refers to a point in the diagram; and
a computing device configured to calculate a difference value for each one of at least two of the diagram axes based in each case on a position of the first user-provided input marker in the diagram, and a position of a second input marker in the diagram,
wherein the second input marker refers to a point in the diagram and is provided by a user as a second user-provided input marker, or wherein the second input marker refers to a point in the diagram and is automatically provided by the computing device as a second automatic input marker, and
wherein the computing device is further configured to calculate a result based on the calculated difference values,
wherein one or more of
one of the diagram axes refers to time, and the other diagram axis refers to a frequency of the measured signals, and the computing device is configured to calculate a chirp rate of the measured signals as result by dividing the difference value referring to the frequency of the measured signals by the difference value referring to time;
one of the diagram axis refers to time, and the other diagram axis refers to phase of the measured signals, and the computing device is configured to calculate a phase drift of the measured signals as result by dividing the difference value referring to the phase by the difference value referring to time; or
one of the diagram axis refers to time, another diagram axis refers to the frequency of the measured signals, and another diagram axis refers to a power value of the measured signals, and the computing device is configured to calculate a chirp rate of the measured signals by dividing the difference value referring to the frequency of the measured signals by the difference value referring to time, and to output an information about at least one of intermodulation products and harmonics of the chirp rate based on the calculated chirp rate.

2. Measurement application device according to claim 1, wherein the diagram comprises a two-dimensional diagram, and wherein the computing device is configured to calculate a first difference value for the X-axis of the two-dimensional diagram, and a second difference value for the Y-axis of the two-dimensional diagram.

3. Measurement application device according to claim 2, wherein the computing device is configured to calculate the result by dividing the first difference value by the second difference value.

4. Measurement application device according to claim 1, wherein one diagram axis refers to time, and the other diagram axis refers to the amplitude of the measured signals; and wherein the computing device is configured to calculate the amplitude droop of the measured signals as result by dividing the difference value referring to the amplitude by the difference value referring to time.

5. Measurement application device according to claim 1, wherein one diagram axis refers to a Q-component of the measured signals, another diagram axis refers to I-component of the measured signals, and the diagram shows an error vector magnitude diagram; and wherein the computing device is configured to calculate the difference between two markers in a Q vs I diagram.

6. Measurement application device according to claim 1, wherein the display device is configured to show the diagram as a waterfall diagram over a predetermined frequency range and a predetermined time;

wherein the input device is configured to receive the first user-provided input marker, and the second input marker at different positions in the waterfall diagram.

7. Measurement application device according to claim 1, wherein the input device is configured to detect a user input on one of the markers or in a predetermined distance from one of the markers, and move the respective marker in the diagram according to the user input.

8. Measurement application device according to claim 1, wherein the input device is configured to receive a user selection of one of the markers; and wherein the display device is configured to modify an appearance of the marker that is selected by the user selection.

9. Measurement application device according to claim 8, wherein the input device is configured to receive a position input while a marker is selected; and wherein the display device is configured to move the marker to a position in the diagram that corresponds to the received position input.

10. Measurement application device according to claim 1, wherein the display device is further configured to continuously update the diagram based on the measured signals; and wherein the computing device is further configured to continuously recalculate the result based on the updated diagram and the positions of the first user-provided input marker, and the second input marker.

11. Measurement application device according to claim 1, wherein the input device is configured to receive a user input; and wherein the display device is configured to set the first user-provided input marker or the second marker to the highest signal value of the measurement signal in a predetermined distance from the position where the user input was received at in the diagram.

12. Measurement application device comprising:

a display device configured to display measured signals in a diagram comprising at least a first diagram axis showing a frequency of the measured signals and a second diagram axis showing time;

an input device configured to receive a first user-provided input marker, wherein the first user-provided input marker refers to a point in the diagram; and a computing device configured to calculate a difference value for each one of the at least two of the diagram axes based in each case on the position of the first user-provided input marker in the diagram, and a position of a second input marker in the diagram, wherein the second input marker refers to a point in the diagram and is automatically provided by the computing device as a second automatic input marker, and wherein the computing device is further configured to calculate a slope of the measured signals based on the calculated difference values.

13. Measurement application device according to claim 12, wherein the computing device is configured to calculate a chirp rate based on at least one of the calculated slope, and the calculated difference values.

14. Measurement application device according to claim 12, wherein the diagram is a waterfall diagram further comprising a third axis showing a signal power of the measured signals.

15. Measurement application device comprising:

a display device configured to display measured signals in a diagram comprising at least a first diagram axis showing a frequency of the measured signals and a second diagram axis showing time;

an input device configured to receive a first user-provided input marker, wherein the first user-provided input marker refers to a point in the diagram; and a computing device configured to calculate a difference value for each one of the at least two of the diagram axes based in each case on the position of the first user-provided input marker in the diagram, and a position of a second input marker in the diagram, wherein the second input marker refers to a point in the diagram and is automatically provided by the computing device as a second automatic input marker, and wherein the computing device is further configured to calculate a chirp rate of the measured signals based on the calculated difference values.

* * * * *